(12) United States Patent
Petunin

(10) Patent No.: US 7,590,963 B2
(45) Date of Patent: Sep. 15, 2009

(54) INTEGRATING MULTIPLE ELECTRONIC DESIGN APPLICATIONS

(75) Inventor: Vladimir V. Petunin, Longmont, CO (US)

(73) Assignee: Mentor Graphics Corporation, Wilsonville, OR (US)

( * ) Notice: Subject to any disclaimer, the term of this patent is extended or adjusted under 35 U.S.C. 154(b) by 511 days.

(21) Appl. No.: 10/983,132

(22) Filed: Nov. 8, 2004

(65) Prior Publication Data

US 2005/0114865 A1      May 26, 2005

Related U.S. Application Data

(60) Provisional application No. 60/523,697, filed on Nov. 21, 2003.

(51) Int. Cl.
*G06F 17/50* (2006.01)
*H03K 17/693* (2006.01)

(52) U.S. Cl. .............................. 716/15; 716/1
(58) Field of Classification Search ............ 716/12–15, 716/1, 8; 707/1; 715/509; 703/13, 14
See application file for complete search history.

(56) References Cited

U.S. PATENT DOCUMENTS

| | | | |
|---|---|---|---|
| 5,107,443 | A | 4/1992 | Smith |
| 5,258,920 | A | 11/1993 | Haller et al. |
| 5,295,081 | A | 3/1994 | Habra |
| 5,333,312 | A | 7/1994 | Wang |
| 5,333,315 | A | 7/1994 | Saether et al. |
| 5,333,316 | A | 7/1994 | Champagne et al. |
| 5,392,400 | A | 2/1995 | Berkowitz |
| 5,452,218 | A | 9/1995 | Tucker et al. |
| 5,544,067 | A | 8/1996 | Rostoker et al. |
| 5,555,388 | A | 9/1996 | Shaughnessy |
| 5,583,993 | A | 12/1996 | Foster et al. |
| 5,604,680 | A | 2/1997 | Bamji et al. |
| 5,745,747 | A | 4/1998 | Chang et al. |
| 5,751,597 | A | 5/1998 | Okano et al. |
| 5,806,058 | A * | 9/1998 | Mori et al. ..................... 707/2 |
| 5,809,240 | A | 9/1998 | Kumagai |

(Continued)

FOREIGN PATENT DOCUMENTS

EP      0558006      9/1993

(Continued)

OTHER PUBLICATIONS

U.S. Appl. No. 60/341,037, filed Jun. 19, 2003.

(Continued)

*Primary Examiner*—Paul Dinh
*Assistant Examiner*—Nha T Nguyen
(74) *Attorney, Agent, or Firm*—Banner & Witcoff, Ltd.

(57) ABSTRACT

Multiple printed circuit board (PCB) application programs simultaneously execute on a computer. Each application stores data regarding a PCB design in a separate database. The databases are based on compatible data models such that each application is able to receive data from other applications and understand what is to be done with that data. When an edit to a PCB design is made by an application, data for the edit is stored in that application's database. The data for the edit is also automatically provided, via a message server program, to other PCB applications. Each PCB application then stores that edit data in its own database.

10 Claims, 12 Drawing Sheets

U.S. PATENT DOCUMENTS

| | | | |
|---|---|---|---|
| 5,826,265 | A | 10/1998 | Van Huben et al. |
| 5,892,900 | A | 4/1999 | Ginter et al. |
| 5,902,240 | A | 5/1999 | Ishii et al. |
| 5,950,201 | A | 9/1999 | Van Huben et al. |
| 5,966,707 | A | 10/1999 | Van Huben et al. |
| 5,983,277 | A | 11/1999 | Heile et al. |
| 6,023,565 | A | 2/2000 | Lawman et al. |
| 6,026,230 | A | 2/2000 | Lin et al. |
| 6,094,654 | A | 7/2000 | Van Huben et al. |
| 6,094,658 | A | 7/2000 | Araki |
| 6,110,213 | A | 8/2000 | Vinciarelli et al. |
| 6,110,223 | A | 8/2000 | Southgate et al. |
| 6,134,549 | A | 10/2000 | Regnier et al. |
| 6,134,705 | A | 10/2000 | Pedersen et al. |
| 6,182,115 | B1 | 1/2001 | Cuomo et al. |
| 6,240,414 | B1 | 5/2001 | Beizer et al. |
| 6,289,254 | B1 | 9/2001 | Shimizu et al. |
| 6,327,594 | B1 | 12/2001 | Van Huben et al. |
| 6,356,796 | B1 | 3/2002 | Spruiell et al. |
| 6,424,959 | B1 | 7/2002 | Bennett et al. |
| 6,442,570 | B1* | 8/2002 | Wu .......................... 707/201 |
| 6,484,177 | B1 | 11/2002 | Van Huben et al. |
| 6,530,065 | B1 | 3/2003 | McDonald et al. |
| 6,578,174 | B2 | 6/2003 | Zizzo |
| 6,594,799 | B1 | 7/2003 | Robertson et al. |
| 6,654,747 | B1 | 11/2003 | Van Huben et al. |
| 6,671,699 | B1 | 12/2003 | Black et al. |
| 6,678,871 | B2 | 1/2004 | Takeyama et al. |
| 6,678,876 | B2 | 1/2004 | Stevens et al. |
| 6,678,877 | B1 | 1/2004 | Perry et al. |
| 6,684,379 | B2 | 1/2004 | Skoll et al. |
| 6,687,710 | B1 | 2/2004 | Dey |
| 6,708,313 | B2 | 3/2004 | Pfeil et al. |
| 6,711,718 | B2 | 3/2004 | Pfeil et al. |
| 6,721,922 | B1 | 4/2004 | Walters et al. |
| 6,751,781 | B2 | 6/2004 | Lin et al. |
| 6,782,511 | B1 | 8/2004 | Frank et al. |
| 6,851,094 | B1 | 2/2005 | Robertson et al. |
| 6,851,100 | B1 | 2/2005 | You et al. |
| 6,931,369 | B1 | 8/2005 | Perry et al. |
| 6,983,434 | B1 | 1/2006 | Frank et al. |
| 7,020,853 | B2 | 3/2006 | Skoll et al. |
| 7,024,433 | B2 | 4/2006 | Arai et al. |
| 7,036,101 | B2 | 4/2006 | He et al. |
| 7,039,892 | B2 | 5/2006 | Mantey et al. |
| 7,076,491 | B2 | 7/2006 | Tsao |
| 7,103,434 | B2 | 9/2006 | Chernyak et al. |
| 7,134,096 | B2 | 11/2006 | Brathwaite et al. |
| 7,143,134 | B2 | 11/2006 | Petrie et al. |
| 7,143,341 | B1* | 11/2006 | Kohli .......................... 715/511 |
| 7,219,311 | B2 | 5/2007 | Koga et al. |
| 7,240,309 | B2 | 7/2007 | Saito et al. |
| 7,246,055 | B1* | 7/2007 | Singh .......................... 703/20 |
| 7,337,093 | B2 | 2/2008 | Ramani et al. |
| 2002/0059054 | A1 | 5/2002 | Bade |
| 2002/0069220 | A1 | 6/2002 | Tran |
| 2002/0120858 | A1 | 8/2002 | Porter et al. |
| 2002/0144212 | A1 | 10/2002 | Lev et al. |
| 2002/0188910 | A1 | 12/2002 | Zizzo |
| 2003/0009727 | A1 | 1/2003 | Takeyama et al. |
| 2003/0018655 | A1* | 1/2003 | Arroyo et al. ............... 707/203 |
| 2003/0101425 | A1 | 5/2003 | Makinen et al. |
| 2003/0131332 | A1 | 7/2003 | Pfeil et al. |
| 2004/0093397 | A1 | 5/2004 | Chiroglazov et al. |
| 2004/0199891 | A1 | 10/2004 | Bentley et al. |
| 2004/0210854 | A1 | 10/2004 | Pfeil et al. |
| 2004/0225988 | A1 | 11/2004 | Petunin et al. |
| 2004/0268283 | A1 | 12/2004 | Perry et al. |
| 2005/0044518 | A1 | 2/2005 | Petunin et al. |
| 2005/0080502 | A1 | 4/2005 | Chernyak |
| 2005/0108663 | A1 | 5/2005 | Bentley et al. |
| 2005/0114821 | A1 | 5/2005 | Petunin et al. |
| 2005/0125763 | A1 | 6/2005 | Lin et al. |
| 2005/0131783 | A1 | 6/2005 | Jin |
| 2005/0160396 | A1 | 7/2005 | Chadzynski |
| 2005/0237776 | A1 | 10/2005 | Gropper et al. |
| 2005/0246672 | A1 | 11/2005 | Bois et al. |
| 2006/0095882 | A1 | 5/2006 | Mankin et al. |
| 2006/0101368 | A1 | 5/2006 | Kesarwani et al. |

FOREIGN PATENT DOCUMENTS

| | | |
|---|---|---|
| EP | 750267 | 6/1995 |
| JP | 02-245865 | 1/1990 |
| JP | 02-048774 | 2/1990 |
| JP | 02-056070 | 2/1990 |
| JP | 04-068470 | 3/1992 |
| JP | 04-362783 | 12/1992 |
| JP | 05-073630 | 3/1993 |
| JP | 0574942 | 3/1993 |
| JP | 05-242174 | 9/1993 |
| JP | 06203108 | 7/1994 |
| JP | 07175842 | 7/1995 |
| JP | 08-235233 | 9/1996 |
| JP | 0962726 | 3/1997 |
| JP | 09-212530 | 8/1997 |
| JP | 09-288690 | 11/1997 |
| JP | 10-105586 | 4/1998 |
| JP | 10307855 | 11/1998 |
| JP | 11-288428 | 10/1999 |
| JP | 2003-186914 | 7/2003 |
| WO | 03050751 | 5/2003 |
| WO | WO 03/050726 | 6/2003 |
| WO | 03088095 | 10/2003 |

OTHER PUBLICATIONS

Michael K.W. Wu et al., Development of an Integrated CAD Tool for Switching Power Supply Design with EMC Performance Evaluation, IEEE Transactions on Industry Applications, vol. 34, No. 2 pp. pp. 364-373, Mar.-Apr. 1998.

Geppert, L. "IC Design on the World Wide Web", IEEE Spectrum. Oct. 2001. pp. 31-36.

CAD Framework Initiative, Inc., Printed from http://www.si2.org on Jun. 23, 2004 (date of first publication unknown).

English Abstract of JP2003-186914, Jul. 4, 2003.

Machine-Generated English Translation of Portions of JP2003-186914, Jul. 4, 2003.

English Translation of Abstract and Claims of JP2003-186914, Jul. 4, 2003.

Printout of web page at <http://www.stella.co.jp/system/data.htm> and English language translation thereof; date of first publication unknown, but prior to Sep. 9, 2003; (2 pages).

Printout of web page at <http://www.stella.co.jp/system/faq.htm> and English language translation thereof; date of first publication unknown, but prior to Nov. 18, 2003; (5 pages).

Printout of web page at <http://www.stella.co.jp/system/multi.htm> and English language translation thereof; date of first publication unknown, but prior to Sep. 9, 2003; (2 pages).

Printout of web page at <http://www.stella.co.jp/system/option.htm> and English language translation thereof; date of first publication unknown, but prior to Sep. 9, 2003; (2 pages).

Printout of web page at <http://www.stella.co.jp/system/pcb_cad.htm> and English language translation thereof; date of first publication unknown, but prior to Sep. 9, 2003; (2 pages).

Printout of web page at <http://www.stella.co.jp/system/print.htm> and English language translation thereof; date of first publication unknown, but prior to Sep. 9, 2003; (3 pages).

Printout of web page at <http://www.stella.co.jp/system/stella_station.htm> and English language translation thereof; date of first publication unknown, but prior to Nov. 18, 2003; (3 pages).

Printout of web page at <http://www.stella.co.jp/system/system.htm> and English language translation thereof; date of first publication unknown, but prior to Sep. 9, 2003; (2 pages).

Printout of web page formerly available at <http://www..ydc.co.jp/cad/epsilon/productC3Design/>; date of first publication unknown, but prior to Feb. 17, 2004; (6 pages).
CAD Framework Initiative, Inc., Printed from <http://www.si2.org> on Jun. 23, 2004 (date of first publication unknown).
Horn, I., et al., "Estimation of the Number of routing Layers and Total Wirelength in a PCT Through Wiring Distribution Analysis", Design Automation Conference, 1996 Proceedings EURO-DAC '06, Sep. 16-20, 1996, pp. 31-315.
Hardwick, M., et al., "Using a Relational Database as an index to a Distributed Object Database in Engineering Design Systems", IEEE, Oct. 16, 1989, pp. 4-11.
Anupam, V., et al., "Collaborative Multimedia Scientific Design in SHASTRA", 1993, pp. 1-12.
Anupam, V., et al., "SHASTRA: Multimedia Collaborative Design Environment," IEEE Multimedia, vol. 1, No. 2, Jun. 21, 1994, pp. 39-49.
Anupam V., et al., "SHASTRA An Architecture for Development of Collaborative Applications", Enabling Technologies: Infrastructure for Collaborative Enterprises, Apr. 20-22, 1993, pp. 155-156.
Honghai, Shen, et al., "Access Control for Collaborative Environments", Oct. 31, 1992, pp. 51-58.
N. Shyamsundar, et al., "Internet-based Collaborative Product Design with Assembly Features and Virtual Design Spaces", Jun. 5, 2001, pp. 637-651.
EP Search Report for EP02795797 dated Oct. 20, 2006.
Translation of an Office Action for JP2003551712 dated Aug. 21, 2006.
"Version Management with CVS for CVS 1.12.9", Chapter 10: Multiple Developers, retrieved from the Internet: <http://ftp.gnu.org/non-gnu/cvs/source/feature/1.12.9/cederqvist-1.12.9.p> retrieved on Jan. 24, 2005; pp. 65-74.
English translation of document titled "Exhibits and other documents" submitted Sep. 29, 2006 in Japanese Patent Application No. 2003-551734, pp. 1-5.
English Language Translation of Publication submission of Japanese Patent Application No. 2003-551734 dated Oct. 25, 2006.
English Language Translation of Japanese Kokai Patent Application No. Hei 5[1993]-242174 published Sep. 21, 1993 (filing No. Hei 4[1992]-41727).
English Language Translation of Japanese Kokai Patent Application No. Hei 11[1999]-288428, published Oct. 19, 1999 (filing No. Hei 10[1998]-91372).
English Language Translation of Japanese Kokai Patent Application No. Hei 9[1997]-288690, published Nov. 4, 1997 (filing No. Hei 8[1996]-122462).
English Language Translation of Japanese Kokai Patent Application No. Hei 2[1990]-245865, published Mar. 20, 1989 (filing No. Hei 1[1989]-65906).
English Language Translation of Japanese Public Patent Disclosure Bulletin No. 10105586, dated Apr. 24, 1998 (application 8-25457).
English Language Translation of Japanese Kokai Patent Application No. Hei 4[1992]-362783, published Dec. 15, 1992 (filing No. Hei 3[1991]-137766).
English Language Translation of Japanese Kokai Patent Application No. Hei 9[1997]-212530, published Aug. 15, 1997 (filing No. Hei 8[1996]-17325).
English Language Translation of Japanese Kokai Patent Application No. Hei 5[1993]-073630, published Mar. 6, 1993 (filing No. Hei 3[1991]-233515).
English Language Translation of Japanese Public Patent Disclosure Bulletin No. 08235233, dated Sep. 13, 1996 (application No. 7-38249).
English Language Translation of Japanese Kokai Patent Application No. Hei 2[1990]-056070, published Aug. 20, 1998 (filing No. Sho 63[1998]-205677).
English Language Translation of Japanese Kokai Patent Application No. Hei 7[1995]-175842, published Jul. 14, 1995 (filing No. Hei 5[1993]-345183).
English Language Translation of Japanese Kokai Patent Application No. Hei 4[1992]-293169, published Oct. 16, 1992 (filing No. Hei 3[1991]-57351).
English Language Translation of Japanese Public Patent Disclosure Bulletin No. 0696160, dated Apr. 8, 1994 (application No. 04244646).
English Language Translation of Japanese Public Patent Disclosure Bulletin No. 06203108, dated Jul. 22, 1994 (application No. 5-154).
English Translation of Toshio Hoshi, "e-PAL 2000" Printed Circuit Board CAD/CAM System, Denshi Zairyo [Electronic Parts and Materials], Oct. 2001, pp. 153-156 (Japanese original included).
English Translation of Yoshiki Koyanagi: Stella Station Multi CAD/CAM System for the Next Generation of Printed Circuit Boards, Denshi Zairyo [Electronic Parts and Materials], Oct. 2000, pp. 96-101 (Japanese original included).
English translation of Japanese Kokai Patent Application No. Hei 7 [1995] -98726, published Apr. 11, 1995 (filing No. Hei 5[1993]-311532), pp. 6-37.
English Language Translation of Japanese Kokai Patent Application No. Hei 4[1992]-68470, published Mar. 4, 1992 (filing No. Hei 2[1990 ]-180448).
English Language Translation of Japanese Kokai Patent Application No. Hei 5[1993]-74942, published Mar. 26, 1993 (filing No. Hei 3[1991 ]-259923).
English Language Translation of Japanese Kokai Patent Application No. Hei 10[1998]-307855, published Nov. 17, 1998 (filing No. Hei 9[1997 ]-118134).
Translation of Japanese Patent Application No. Hei 2[1990]-48774, published Feb. 19, 1990 (filing No. Sho 63 [1988]-199358).
English language translation of Japanese Public Patent Disclosure Bulletin No. 9-62726, dated Mar. 7, 1997 (application 7-220142).
English translation of an Office Action for JP2003551712 dated May 29, 2007.
Translation of an Office Action for JP2003551734 dated Aug. 21, 2006.
International Search Report of PCT/US02/39347 dated Mar. 27, 2003.
International Search Report of PCT/US02/39394 dated Jun. 19, 2003.
Mar. 14, 2008 Official Communication in European Patent Application 02 797 245 (6 pages).
Mar. 25, 2008 Third Party Submission in European Patent Application 02 797 245, with attachments (44 pages).
Translation of Jan. 8, 2008 Decision of Refusal in Japanese Patent Application 2003-551734 (3 pages).
May 30, 2007 Office Action in European Patent Application 02 797 245 (6 pages).
Translation of May 29, 2007 Office Action in Japanese Patent Application 2003-551734 (3 pages).
International Preliminary Report on patentability for PCT/US2006/035374 dated Mar. 18, 2008.
Supplementary European Search Report for EP 02 795 797 dated Jul. 3, 2007.
May 14, 2007 Letter supplementing the Search Report and the Supplementary Partial European Search Report dated Oct. 20, 2006.
Feb. 6, 2008 Office Action in EP 02 795 797.6 (3 pages).
English translation of Mar. 8, 2006, submission by undisclosed third party in Japanese Patent Application 2003-551734 (2 pages).
English translation of Mar. 8, 2006, submission by undisclosed third party in Japanese Patent Application 2003-551712 (2 pages).
English translation of Mar. 29, 2007, submission by undisclosed third party in Japanese Patent Application 2003-551734 (7 pages).
English translation of Oct. 25, 2007, submission by undisclosed third party in Japanese Patent Application 2003-551734 (4 pages).
English translation of Sep. 29, 2006, submission by undisclosed third party in Japanese Patent Application 2003-551712 (15 pages).
English translation of Apr. 4, 2007, submission by undisclosed third party in Japanese Patent Application 2003-551734 (9 pages).
English translation of Oct. 25, 2007, submission by undisclosed third party in Japanese Patent Application 2003-551712 (4 pages).
Konduri, et al., "A Framework for Collaborative Design and Distributed Web-Based Design", 1999, pp. 898-903.
Konduri, et al., "Vela Project on Collaborative Distributed Design: New Client/Server Implementations", May 6, 1999, pp. 1-8.
Datasheet for "Allegro PCB Design 220", by Cadence; Mar. 9, 2004, 8 pages.

Saha, et al., "Web-Based Distributed VLSI Design", MIT, published Jan. 4-7, 1998, pp. 449-454.

"Vela Project—Globally Distributed Microsystem Design" by CBL, Jun. 1998, 23 pages.

Google™ Search bearing date of Apr. 28, 2008; provided by examiner of U.S. Appl. No. 10/960,793.

* cited by examiner

DB 12 (application E)

| component | location | layer | other | |
|---|---|---|---|---|
| | location(a) | layer(a) | description(a) | |
| component(b) | location(b) | layer(b) | | |
| | location(c) | layer(c) | HDI(c) | m-v_data(c) |

DB 14 (application F)

| HDI# | location | layer | micro-via_data | other |
|---|---|---|---|---|
| | location(a) | layer(a) | | description(a) |
| | location(b) | layer(b) | | component(b) |
| HDI(c) | location(c) | layer(c) | m-v_data(c) | |

DB 22 (application G)

| component | location | layer | description | other | |
|---|---|---|---|---|---|
| | location(a) | layer(a) | description(a) | | |
| component(b) | location(b) | layer(b) | | | |
| | location(c) | layer(c) | | HDI(c) | m-v_data(c) |

FIG. 10

INTEGRATING MULTIPLE ELECTRONIC DESIGN APPLICATIONS

CROSS-REFERENCE TO RELATED APPLICATIONS

This application claims the benefit of U.S. Provisional Application Ser. No. 60/523,697, filed Nov. 21, 2003, titled "A Revolutionary Design Technology," which application is incorporated by reference.

FIELD OF THE INVENTION

This invention relates to the field of electronic design automation tools. More specifically, embodiments of the invention pertain to methods for integrating the operation of multiple software application programs used for different aspects of designing a printed circuit board.

BACKGROUND OF THE INVENTION

When initially developing an electronic device, one or more engineers may determine the various circuits and circuit components needed to carry out the desired functions and features of an electronic device. These circuits are often described with one or more schematic diagrams which identify circuit components (e.g., integrated circuits (ICs), resistors, capacitors, etc.) and the necessary electrical connections between those components. Once the underlying circuit is developed, the schematic (or other circuit description) is often the starting point for developing other information needed to manufacture the device. For example, many electronic devices include one or more printed circuit boards (PCBs) on which the necessary circuits for an electronic device are physically contained. In order to build a PCB, additional information regarding placement of circuit components on the board and routing of connections between those components is needed.

Designing PCBs, e.g., determining component placement and interconnection, is a complex and time-consuming process. More complex circuit designs may involve hundreds of components and thousands of inter-pin connections. Component placement and connection routing are interrelated, and it is sometimes necessary to revise component arrangement to achieve a particular set of connections. Aside from the often formidable task of simply finding a geometric arrangement of components that will permit all desired connections, numerous design rules are typically imposed. As one example, conductive traces may require a minimum separation. As another example, it is often desirable to minimize the number of vias connecting different PCB layers. These rules can further complicate the PCB design process.

Because of the complexity involved in PCB design, and because the widely differing needs (and/or preferences) of different companies, PCB design often involves a collection of application programs. One application program may provide basic layout and/or routing functions. Another program, perhaps available as an add-on to the basic application, may provide design capability for embedded circuit components (passive or active). Still another program may be needed for design of specialized circuits (e.g., circuits having RF functionality). Moreover, various other software applications may also be used during the PCB design process. As but one example, certain arrangements of components and connecting paths can introduce unwanted electrical effects; it is thus often desirable to simulate the operation of a PCB and/or perform other analysis during the PCB design process.

In many cases, a single PCB designer may wish to simultaneously use multiple application programs during a single design session. In other words, a designer may have several application programs concurrently running on a computer workstation. As the designer performs tasks requiring different applications, the designer switches between the applications as needed. Using current methods, however, this is often a tedious and error-prone endeavor. In many cases, each application has its own unique format for storing data, which format is not compatible with formats used by other applications. In the past, communications between PCB design applications has often required writing a separate interface program to convert the ASCII output of one application into a form of input recognized by another application. This has led to the creation of hundreds of ASCII interfaces to permit communication between different applications. Each time one of those applications is modified, interface programs for that application may also require modification.

Moreover, existing methods do not permit automatic communication of data between PCB design applications. When switching from one application to another, a designer must manually invoke a separate program to take the data from one application and convert it to a form recognized by a second application. The designer must then import that converted data to the second application. This importation step may require the user to manually invoke additional commands. In addition to consuming valuable designer time and generally being an inconvenience, all of this can cause errors. If, for example, a designer switches directly from a first application to a second without converting the most recent data from the first application and transferring the converted first application data to the second application, the designer may unwittingly have different versions of the PCB design within each application.

SUMMARY OF THE INVENTION

Embodiments of the invention provide a method by which multiple printed circuit board (PCB) application programs may be simultaneously used in a more efficient manner. In at least some embodiments, each application uses a compatible data model (e.g., the same or substantially the same data model). In some cases, one application may generate data that is not used by another application. However, each application is able to receive data from other applications and understand what is to be done with that data.

In a first embodiment, the invention includes a method for integrating execution of, and data sharing between, a plurality of printed circuit board (PCB) application programs simultaneously executing upon a computer. A first user input is received by a first application of the plurality. Data regarding a PCB design is generated by the first application in response to the first user input. The generated data is stored within a first database associated with the first application. At least a portion of the generated data is also stored within a second database associated with a second application of the plurality. The second application receives a second user input and generates additional data regarding the PCB design in response to the second user input and using at least a portion of the data stored in the second database. Additional embodiments include machine-readable media having stored instructions for performing steps similar to those of the first and second embodiments.

These and other features and advantages of the present invention will be readily apparent and fully understood from the following detailed description of preferred embodiments, taken in connection with the appended drawings.

BRIEF DESCRIPTION OF THE DRAWINGS

The foregoing summary of the invention, as well as the following detailed description of preferred embodiments, is better understood when read in conjunction with the accompanying drawings, which are included by way of example, and not by way of limitation with regard to the claimed invention.

FIG. 7-10 illustrate, according to at least some embodiments of the invention, use of databases having compatible data models.

DETAILED DESCRIPTION OF THE PREFERRED EMBODIMENTS

Figure 1:
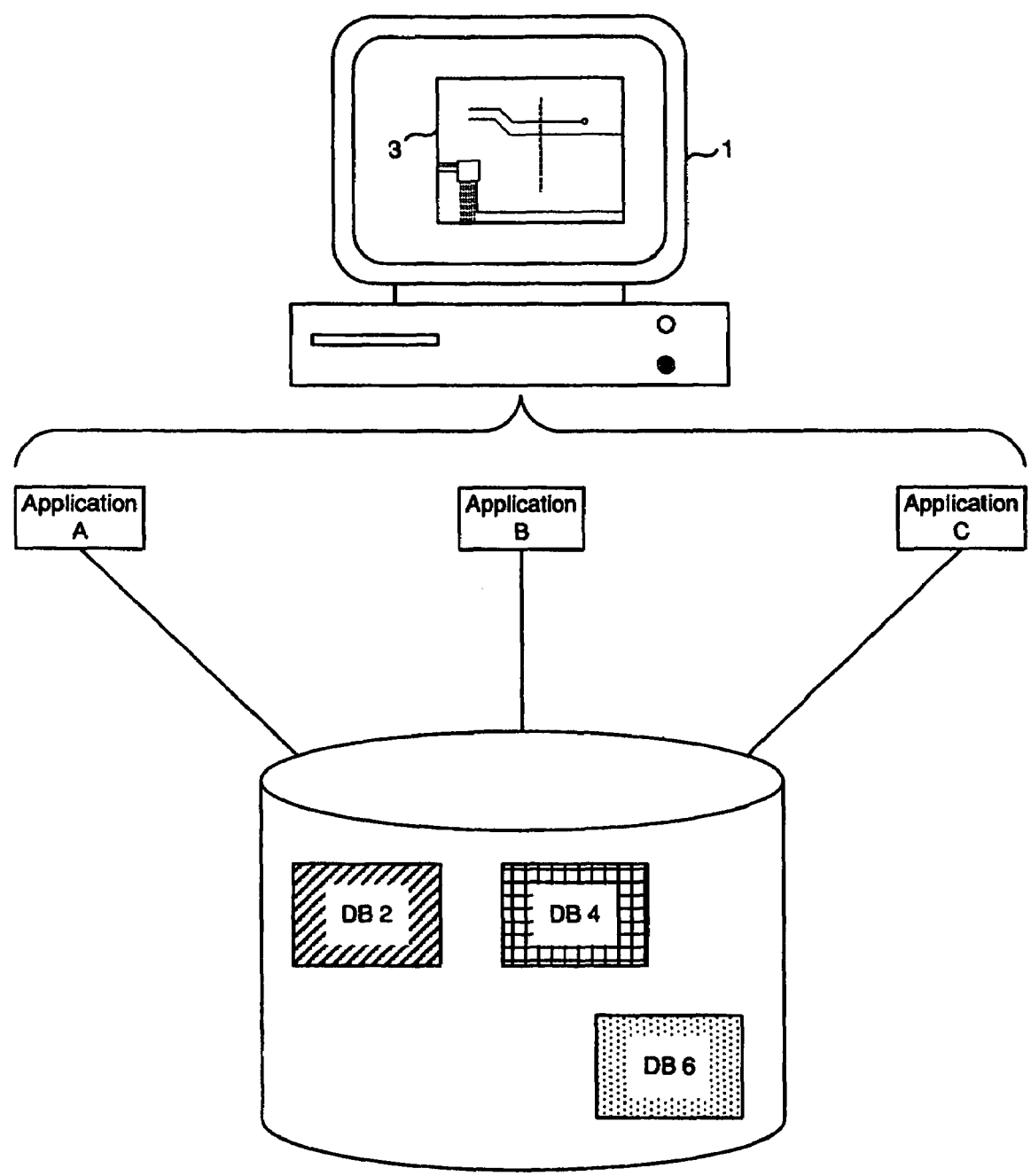
FIGS. 1 and 2 illustrate prior art methods for PCB design using multiple applications simultaneously running on a designer's workstation
Figure 2:
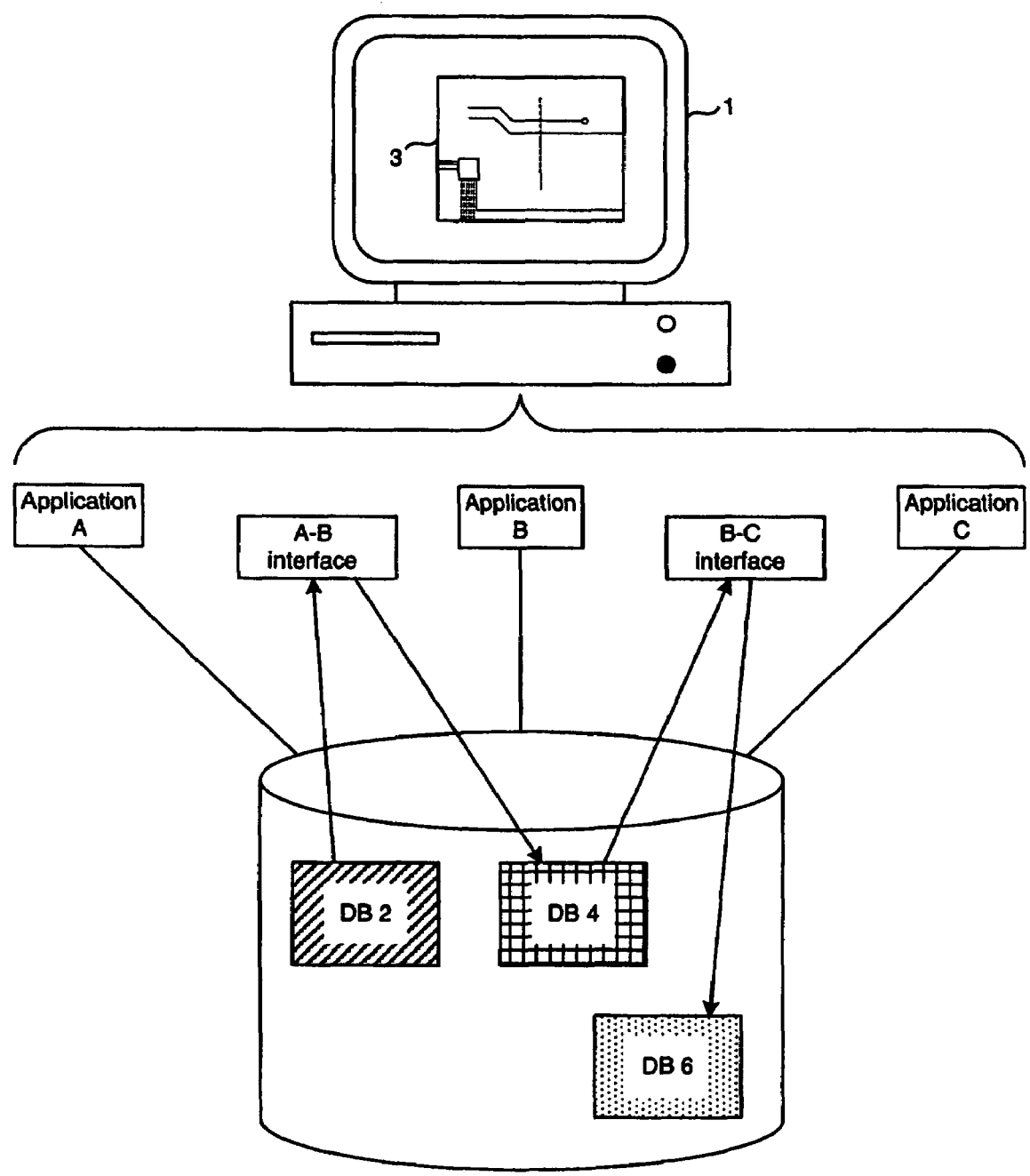

To aid understanding of various embodiments of the invention, FIGS. 1 and 2 illustrate prior art methods for PCB design using multiple applications simultaneously running on a designer's workstation 1. In FIG. 1, the designer (not shown) is working upon a PCB design 3 using three applications A, B and C. Application A stores data for changes to PCB design 3 in a database 2 in a first manner (symbolically shown with diagonal cross-hatching). Application B stores data for changes to PCB design 3 in a database 4 in a second manner (shown with checked cross-hatching). Application C stores data for changes to PCB design 3 in a database 6 in a third manner (shown with stippling). In FIG. 2, the designer has been editing PCB design 3 using application A. Edits made with application A are stored by application A in database 2. After making edits with application A, the designer wishes to make additional edits to PCB design 3 using application B. Data for previous work on PCB design 3 made using application B is stored in database 4, but database 4 does not reflect the latest edits made with application A. To perform work with application B using the latest edits made with application A, the designer first invokes an interface program A-B. Interface A-B converts the data generated by application A into a form understood by application B. The designer then switches to application B, retrieves the data converted by interface A-B, and incorporates that converted data into the database maintained by application B. When the designer then wishes to make edits using application C, the designer must invoke another interface B-C. Interface B-C converts the data generated by application B into a form understood by application C. The designer then switches to application C, retrieves the data converted by interface B-C, and incorporates that converted data into database 6 maintained by application C. As can be appreciated, PCB design with multiple applications can involve significant time and inconvenience using prior art methods, due to the numerous steps needed to switch between the applications.

Figure 3:
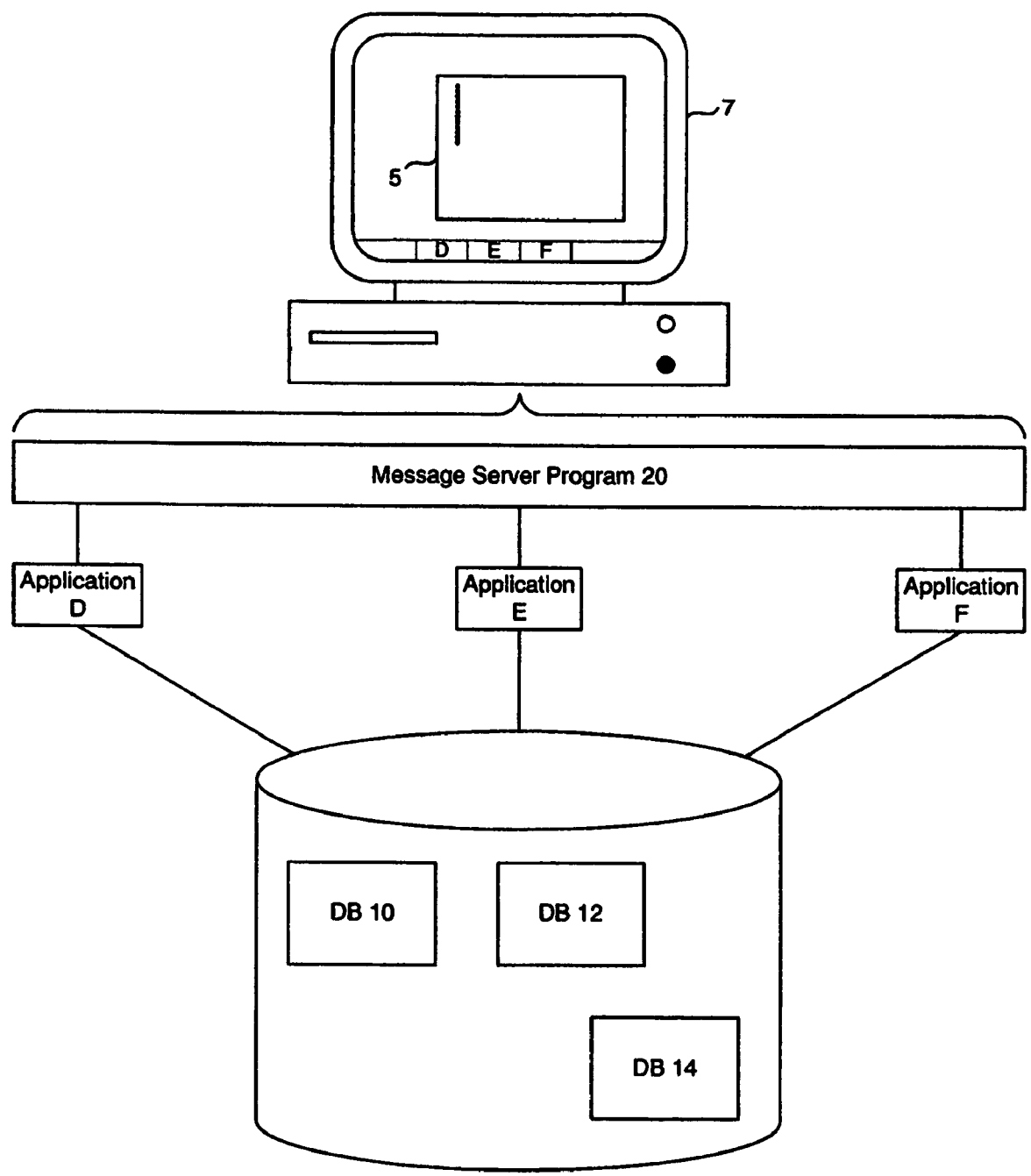
FIGS. 3-6 show communication among three PCB design applications according to at least some embodiments of the invention.

FIG. 3 shows communication among three PCB design applications D, E and F according to at least some embodiments of the invention. Applications D, E and F simultaneously execute (or "run") on a computer workstation 7. Computer 7 is a conventional computer having, e.g., one or more processors, non-volatile storage (e.g., a hard disk drive), volatile memory (e.g., RAM) and other elements well-known in the art. For purposes of illustration, application D is a basic PCB design tool for placement of conventional electronic components and routing connections between component pins. Application E is a more specialized design tool used for placing and connecting embedded components in a PCB design. As known in the art, embedded components include passive components (e.g., resistors, capacitors, inductors) that are formed within the PCB instead of being discrete components soldered to the PCB. Application F is another specialized design tool used for design of micro-via layers and other features associated with specialized high-pin count IC packages using ball grid arrays. Application D is not able to edit data for embedded components, micro-vias, or interconnections between micro-vias. However, application D must be kept aware of changes made by applications E and F. Similarly, application E must be kept aware of changes made by applications D and F, and application F must be kept aware of changes made by applications D and E. Specific aspects of applications D, E and F are provided to serve as convenient examples in the following description. The invention is not limited by the types of applications used as examples.

Unlike databases 2, 4 and 6 used by applications A, B and C (FIGS. 1 and 2), databases 10, 12 and 14 in which applications D, E and F respectively store edit data are based on compatible data models. In particular, application D stores data for PCB design features in a manner understood by applications E and F, application E stores data for PCB design features in a manner understood by applications D and F, and application F stores data for PCB design features in a manner understood by applications D and E. In at least some embodiments, each database is based on the same (or substantially the same) data model. When edits to the PCB design are made using application D, application D generates data which is usable during later editing with applications E and F. Similarly, application E generates data which is used during later edits by applications D and F. However, application E also generates data which is not used by application D and data which is not used by application F. Such data is stored by applications D and F without further processing. Application F similarly generates data later used by applications D and E, as well as data not used by applications D and E which is stored by D and E without further processing.

Figure 4:
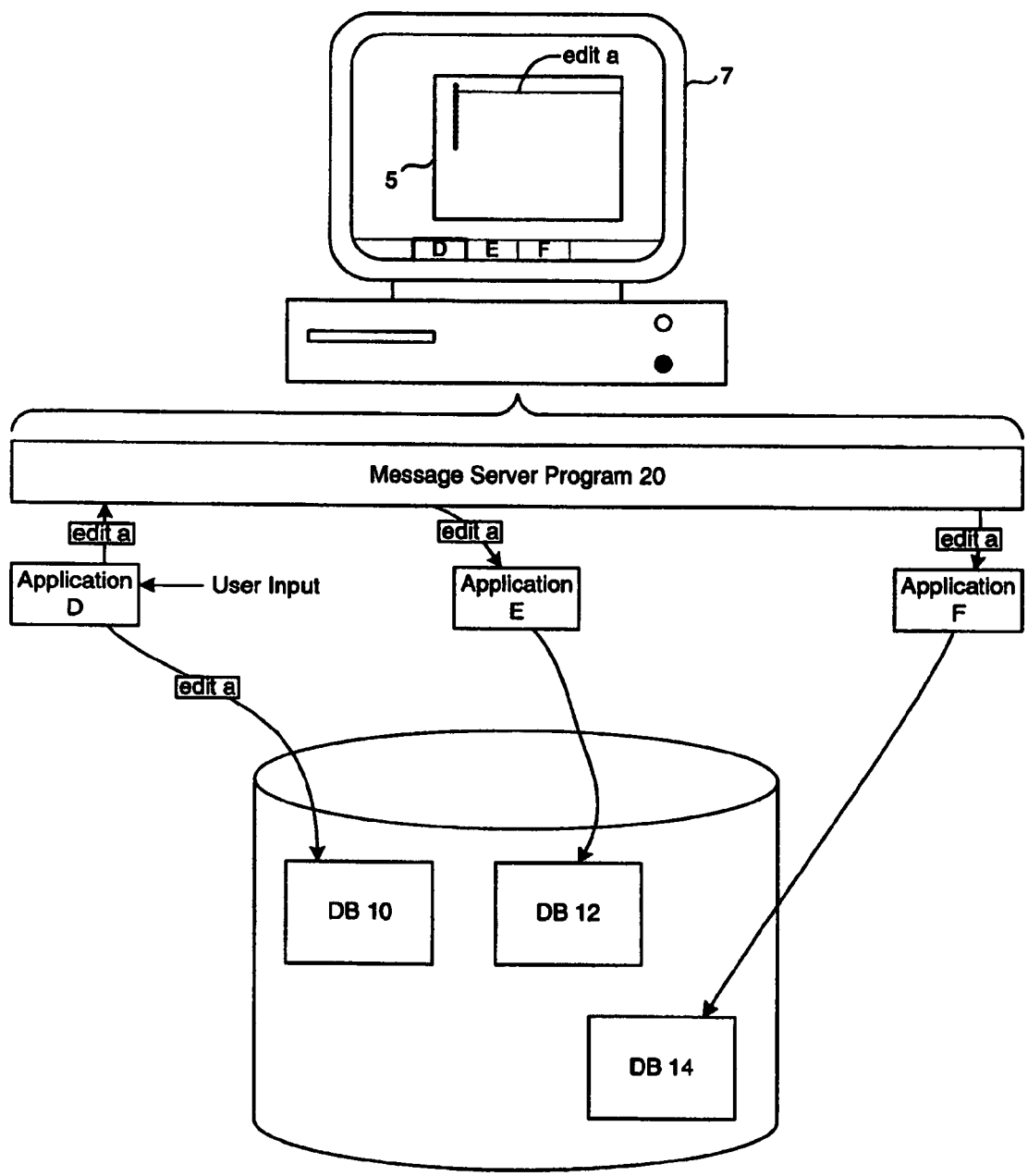

In addition to applications D, E and F, a message server application 20 is also running on computer 7. As one of applications D, E or F makes an edit to PCB design 5, the application also submits that edit to message server program 20. Message server program 20 then submits that change to the other running applications. This is further illustrated in FIG. 4. The user provides input to application D and makes an edit (edit a) to PCB design 5. Application D then stores data for that edit in database 10. Application D also sends a message to message server program 20 indicating that the edit has been made. Message server program 20 then sends messages to applications E and F to update their respective databases 12 and 14 to include the data for edit a. So as to provide a convenient way of describing operations of embodiments of the invention, the drawings and specification will refer to different programs on the same computer sending (or providing, forwarding, etc.) data to and receiving data from one another. As persons skilled in the art will appreciate, however, an actual physical movement of such data is not necessarily required. In FIG. 4, for example, application D may store data for edit a in one or more memory locations within RAM. Application D may send an instruction to message server program 20 indicating that edit a has been made and advising of the RAM location(s) where edit a data is located. Message server program 20 may then send instructions to applications E and F containing the RAM location, and instructing applications E and F to access the edit a data from that location.

In some cases, an actual movement of data from one location to another may be involved. For example, each of applications E and F, upon accessing a RAM location containing the edit a data, stores the edit a data in a separate database. Each database may have a separate location in storage (e.g., copies of edit a data are placed in database 12 and in database 14). Although applications D, E and F may store data on a single device (e.g., a single hard drive of a computer), each application maintains its own database. These databases each use a data model in which edit data provided by other applications can be readily stored and accessed.

Figure 5:
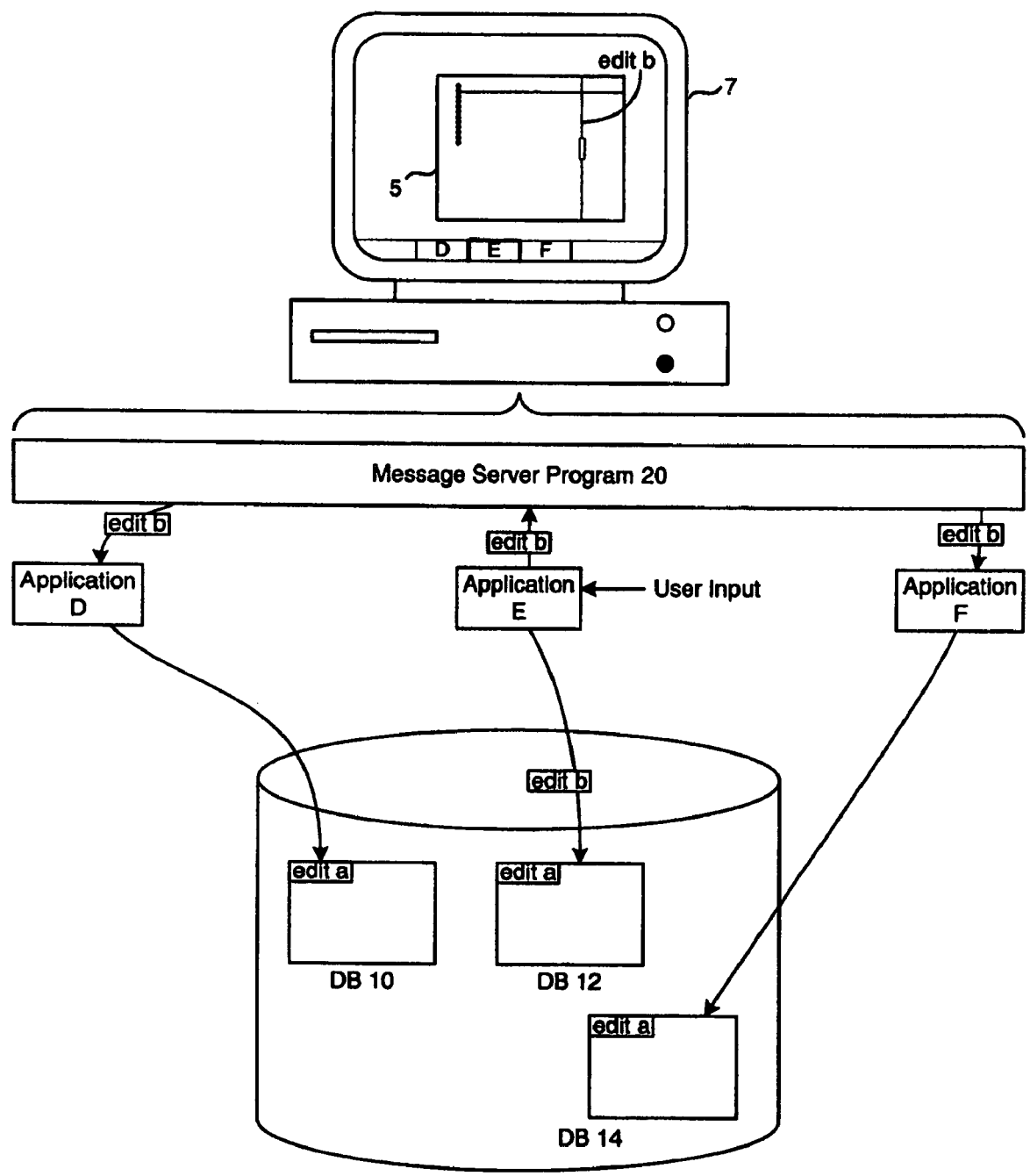
Figure 6:
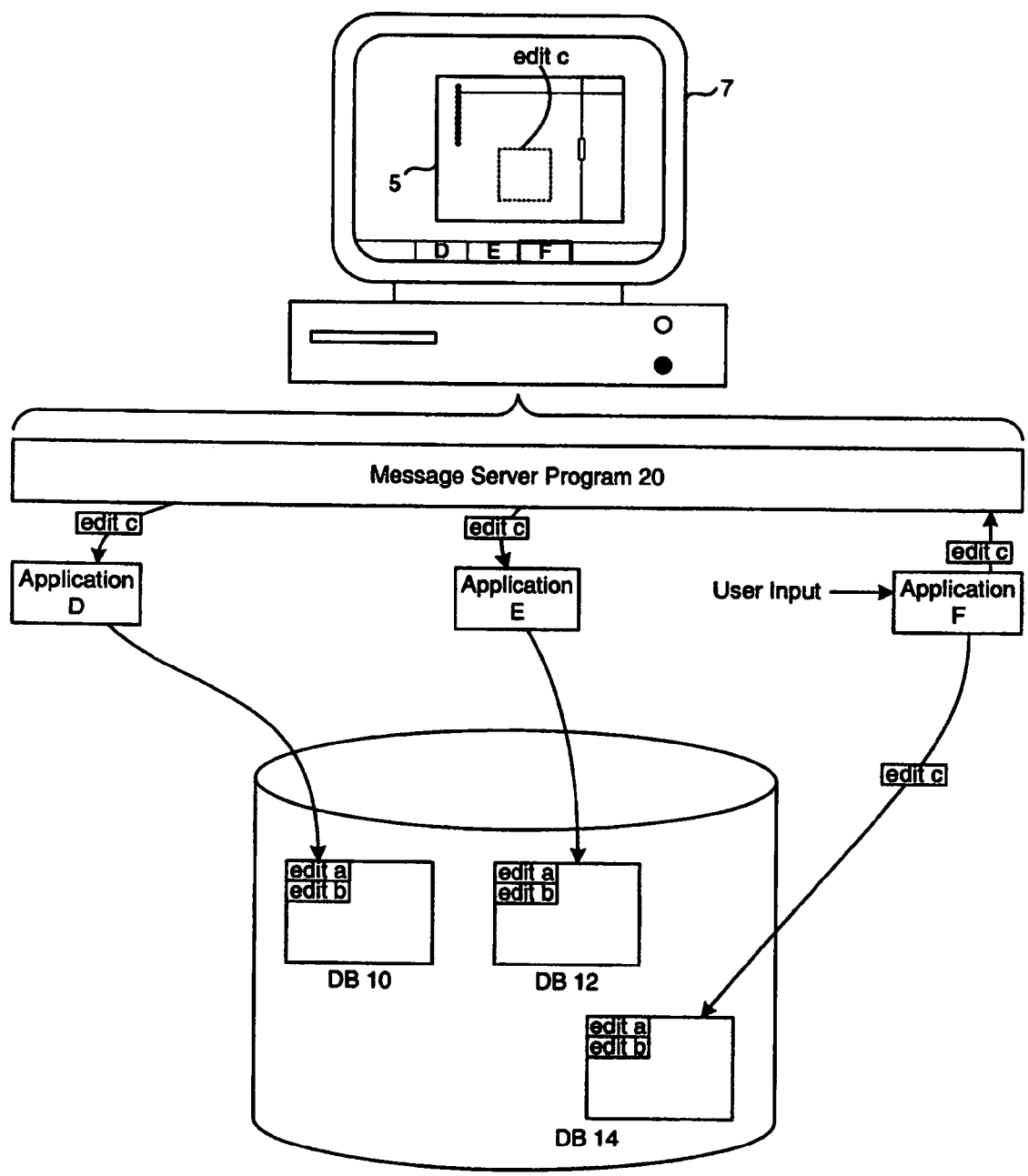

As shown in FIG. 5, the user next provides input to application E and makes an edit (edit b) to PCB design 5. Because edit a (made with application D) was automatically provided to application E (and application F), the user can simply switch to application E without first invoking a separate interface program and without manually inputting separate commands to import edit a data from database 10 to database 12. As the user makes edit b with application E, that edit is automatically provided to message server program 20, which in turn automatically provides the data for edit b to applications D and F. In FIG. 6, the user provides input to application F and further edits PCB design 5. That edit (edit c) is also provided to message server 20 automatically by application F and forwarded by message server 20 to applications D and E.

Because applications D, E and F generate and store edit data based upon compatible data models, each application is able to take account of data from other applications when making edits to PCB design 5. For example, each of applications D, E and F requires basic information about the location of electronic components, routes and vias. If application D adds a route and via to the PCB design, application E may later use information regarding the location of the added route and via when deciding where to place an embedded component. Similarly, that information may also be used by application F when connecting a layer of micro-vias to a component elsewhere in the design. In other cases, data from one application may not be used in the same way by another application, or may not be used at all. For example, when application E adds an embedded component to PCB design 5, and edit data for that component is provided to applications D and F, applications D and F may not use all of the data from application E. Specifically, application D is not able to edit or modify an embedded component. However, the presence of that component impacts where application D may route additional connections, locate vias, or place components. Application D thus uses information about the location of an embedded component placed by application E (e.g., treats the embedded component location as an area where application D cannot edit the design), but does not use other information about the component (e.g., the internal structure of the component, its electrical properties, etc.) Application D simply stores the unused data in its database 10.

Figure 7:
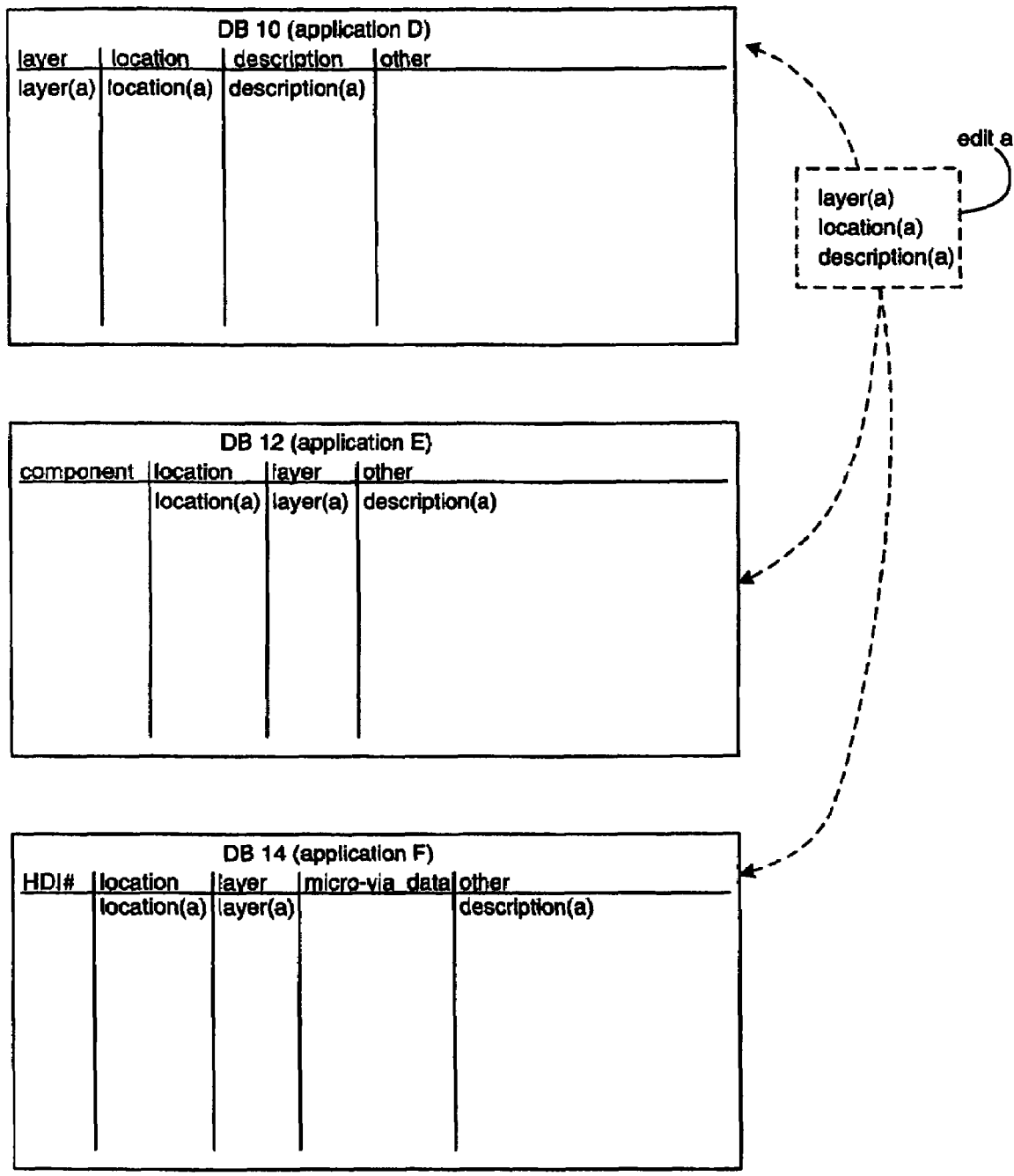

FIG. 7 further illustrates the use by applications D, E and F of databases having compatible data models. Database 10 for application D is shown schematically as a table having four columns ("layer," "location," "description" and "other"). Database 10 stores three types of data for an edit to PCB design 5 made by application D. "Layer" refers to the PCB layer on which a trace, via or component is located. "Location" refers to the x and y locations of an outline of the area occupied by a trace, via or other object in a particular layer (i.e., for a given value in the "layer" column). The "description" column contains data identifying what is located at a particular location on a particular layer. For example, a trace would have entries in a row of database 10 for the layer on which the trace is located, the x and y locations of the outline of the trace, and a description of what is present (a trace). A via would have location and description entries in multiple rows, as a via traverses multiple layers. In other words, a via would have entries in one row for a first layer, for x and y locations and description, would have entries in a second row for a second layer, x and y locations and description, etc. An electronic component would have an entries in a row of database 10 for the layer (top or bottom) on which the component is located, the x and y locations for the area occupied by the component and a description. The "other" column is described below.

Database 12 for application E is shown as a table with four columns ("component," "location," "layer" and "other"). Database 12 also stores three types of data for an edit to PCB design 5 made by application E. "Component" describes the type of embedded component (e.g., resistor, capacitor, embedded IC) placed on the PCB design using application E. "Location" contains data regarding the x and y locations of the component on the board, and "layer" indicates a layer of the PCB where the embedded component is located. Because an embedded component can occupy several layers, a single embedded component may have entries in multiple rows of database 12 (e.g., identical "component" and "location" entries for each of multiple "layer" entries). The "other" column is described below.

Finally, database 14 for application F is shown schematically as a five-column table ("HDI#," "location," "layer," "micro-via data" and "other"). "HDI#" refers to an identifying number for each region of PCB design 5 where a collection of high-density interconnects (HDI) is placed using application F. "Location" is used to hold the x and y locations on a PCB where an HDI collection is placed with application F. "Layer" refers to the layer (e.g., top or bottom surface of the PCB) where an HDI is located. The column for "micro-via_data" is used to hold specific data regarding micro-vias and related structures in an HDI region. The "other" column is discussed below.

FIG. 7 also shows additions made to databases 10, 12 and 14 when application D makes edit a to PCB design 5. Data for the edit (in this case, a trace on a single layer) is added to a row of database 10 as entries "layer(a)," "location(a)" and "description(a)." When data for edit a is sent to application E, application E stores the location(a) and layer(a) edit data in the appropriate fields of a row in database 12. Because application E does not use the description(a) data, application E places that data in the "other" column of the database 12 row containing location(a) and layer(a). When the data for edit a is received by application F, the location(a) and layer(a) data is placed in the appropriate columns in a row of database 14. The description(a) data is placed in the "other" column of database 14, as application F does not use that data.

Figure 8:
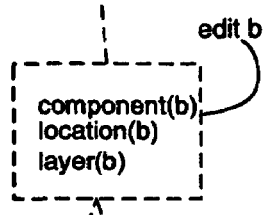

In FIG. 8, the user has switched to using application E and has made edit b to PCB design 5. Because data for edit a was automatically incorporated into database 12, and because application E uses database 12 when editing PCB design 5, the location(a) and layer(a) data was taken into account when making edit b. Moreover, the user was not required to first invoke a separate program to convert the edit a data to a form usable by application E. The user was similarly not required to manually invoke commands to import edit a data into database 12. Application E populates a row of database 12 with the data for edit b ("component(b)," "location(b)" and "layer(b)"). When that data is received by application D, it is placed in a row of database 10. The location(b) and layer(b) data is placed in the location and layer columns, and the component(b) data, which is not used by application D, is placed in the "other" column. Application F similarly places the location(b) and layer(b) data in the location and layer columns of a database 14 row, and places the component(b) data (not used by application F) in the "other" column.

Figure 9:
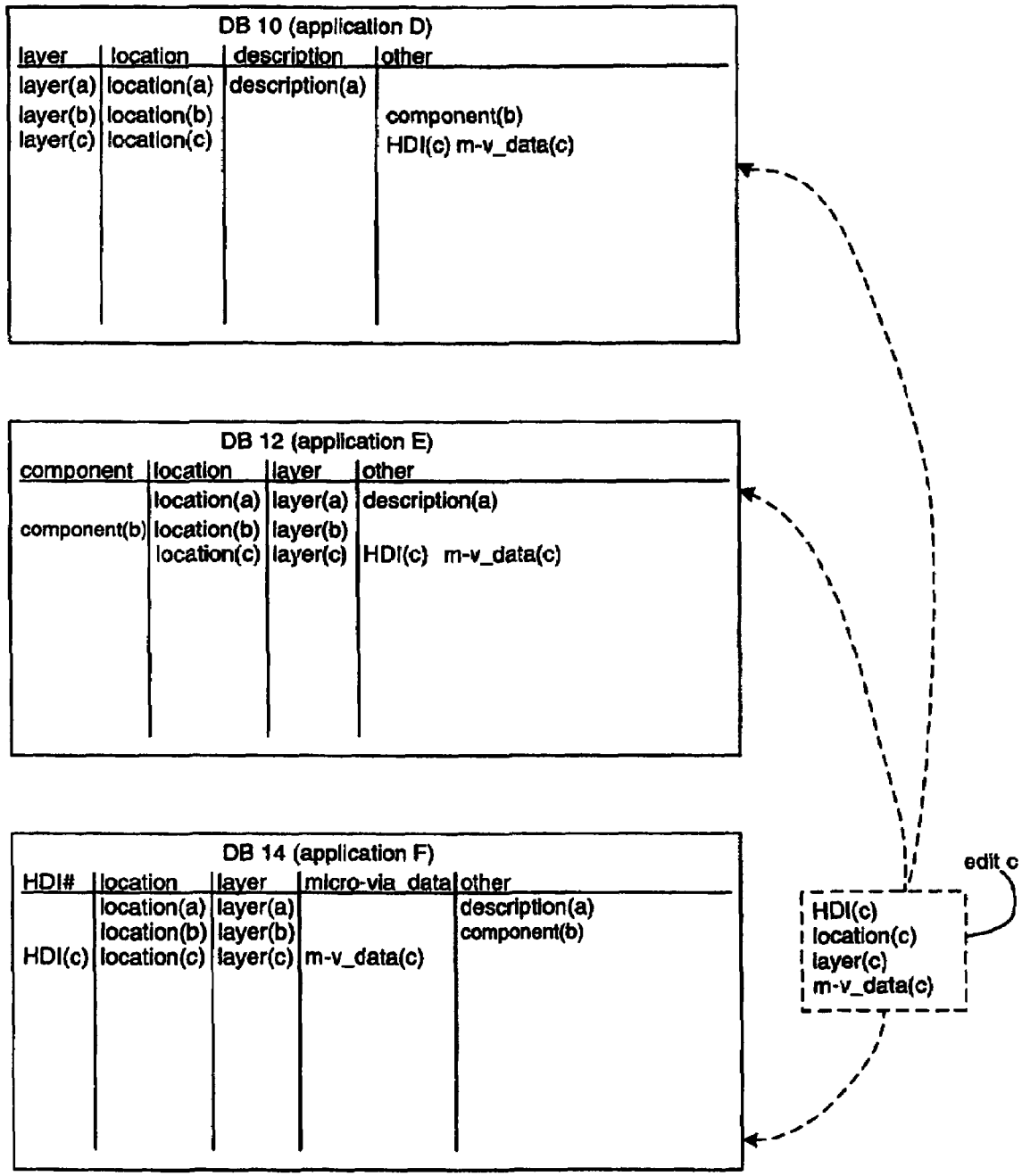

In FIG. 9, the user has switched to using application F and has made edit c to the PCB design. Because data for edits a and b was automatically incorporated into database 14, and because application F uses database 14 when editing PCB design 5, the location(a), location(b), layer(a) and layer(b) data was taken into account when making edit c. Moreover, the user was not required to first invoke a separate program to convert the edit a or edit b data to a form usable by application F. The user was similarly not required to manually invoke commands to import edit a or edit b data into database 14. Application F populates a row of database 14 with the data for edit c ("HDI(c)," "location(c)," "layer(c)," and "micro-via_data(c)"). When that data is received by application D, the location(c) and layer(c) data is placed in the location and layer columns of a database 10 row. The HDI(c) and micro-via_data(c) data is not used by application D, and is placed in the "other" column. Application E similarly places the location (c) and layer(c) data in the location and layer columns of a database 12 row, and places the HDI(c) and micro-via_data (c) data (not used by application E) in the "other" column.

In FIG. 10, the user has activated another application program (application G). In other words, application G was not previously running on computer 7, and the user has caused computer 7 to load and begin executing application G. Because application G was not running when edits a, b or c were made, the database 22 for application G does not currently contain data for the latest edits to the design. Accordingly, upon detecting the presence of previously non-running design application G, message server program 20 forwards the contents of the database of the application in which the user last took action before activating application G. In the example, the user activated application G immediately after making edit c with application F, and database 14 is thus forwarded to application G. Application G uses location, layer, description and component data, but does not use micro-via_data or HDI# entries. Although the description(a) and component(b) data was contained in the "other" column of database 14, application G recognizes the description(a) and component(b) data based on flags or other unique data type descriptors contained in description(a) and component (b).

FIGS. 7 through 10 and the related description are a simplified example of multiple design applications having compatible databases. The example is for purposes of illustrating operation of embodiments of the invention. In practice, a database for PCB design data will often be much more complex and contain numerous other types of data. Such a database need not be stored as a table.

Figure 11:
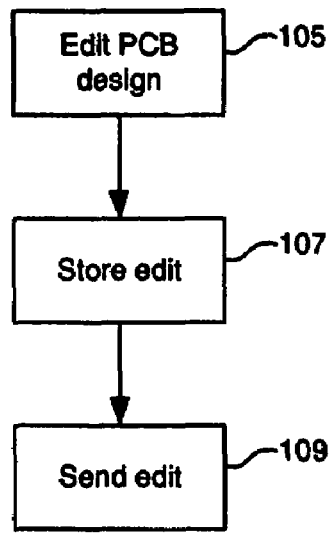
FIG. 11 is a flow chart showing, according to at least one embodiment of the invention, operation of an active design application with which a user is currently editing a PCB design.

FIG. 11 is a flow chart showing, according to at least one embodiment of the invention, operation of a design application with which a user is currently editing a PCB design. In block 105, the user makes an edit to the PCB design. This edit may be performed in many ways (e.g., selecting and moving a trace, via or component; highlighting a region with a cursor and entering a command to insert an object; selecting an object and deleting it). After the edit is complete, data for the edit is stored in the application's database at block 107. The application then notifies the message server program of the edit in block 109, and forwards the edit data to the message server program.

Figure 12:
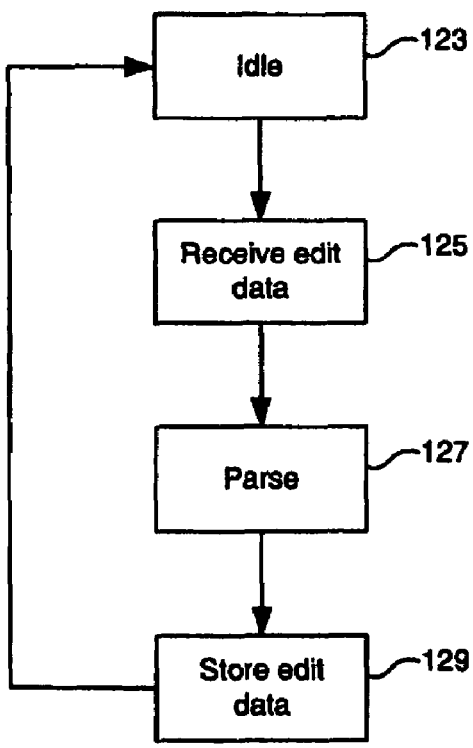
FIG. 12 is a flow chart showing, according to at least one embodiment of the invention, operation of a design application with which a user is not currently editing a PCB design.

FIG. 12 is a flow chart showing, according to at least one embodiment of the invention, operation of a design application with which a user is not currently editing a PCB design. In block 123, the application is idle, and waits for a message from the message server program. At block 125, the application receives a message from the message server program containing (or pointing to) data for an edit made by the user with a different application. The edit data is parsed at block 127 to identify the type(s) of data provided, and/or to adjust for any differences between the format of the data and the format in which the receiving application will store the data. In block 129, the receiving application stores the data in its database, and then returns to block 123.

Figure 13:
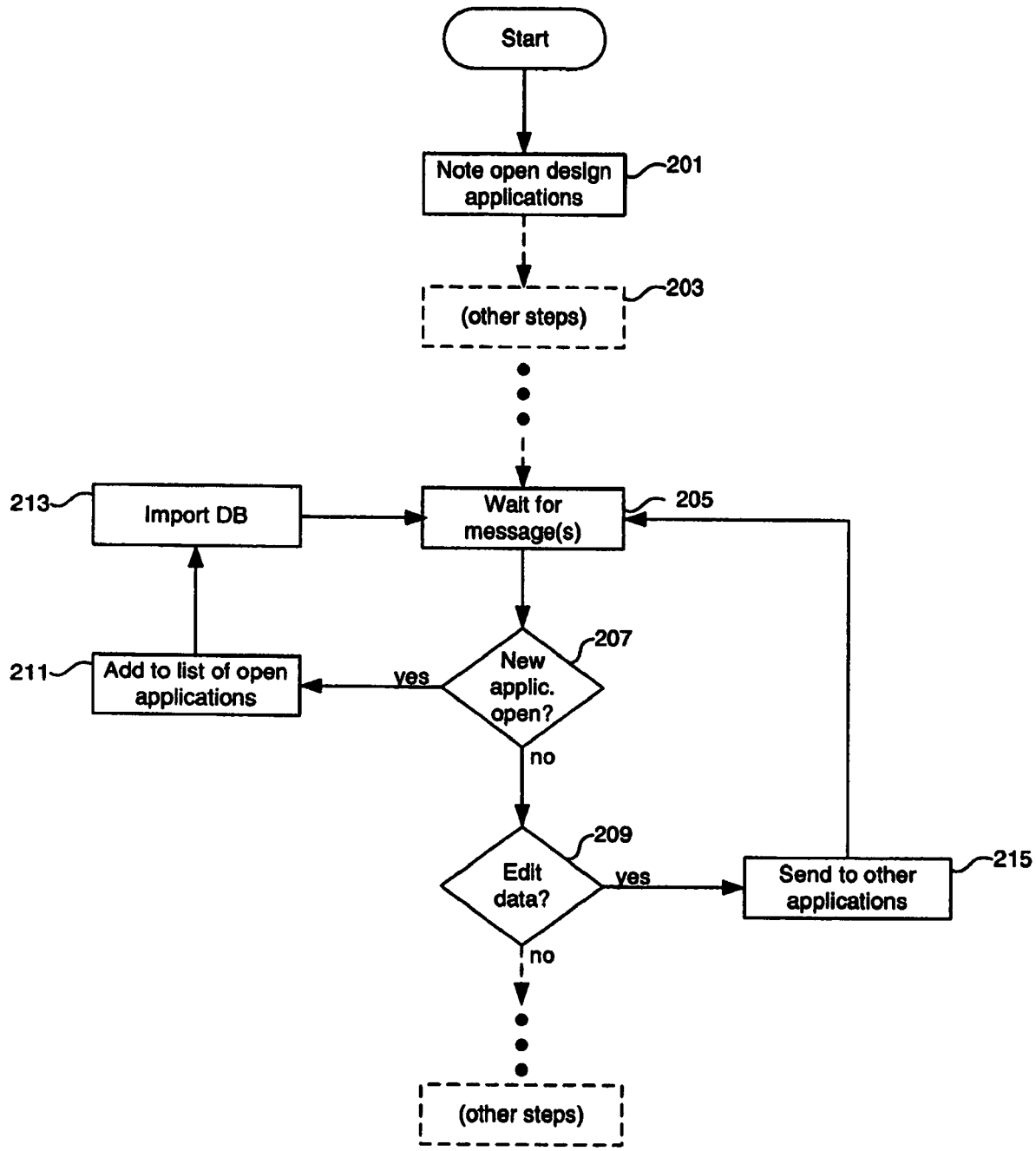
FIG. 13 is a flow chart showing, according to at least one embodiment of the invention, operation of a message server program.

FIG. 13 is a flow chart showing, according to at least one embodiment of the invention, operation of a message server program. After initialization ("start"), the program determines at block 201 if the user activated any design applications prior to activating the message server program. If so, the message server program takes note of all running applications so that future edit data can be provided to each application. In at least one embodiment, the message server program maintains a list of all currently running design applications. In some embodiments, and as shown by the dashed line block 203 and the vertical ellipsis, the message server program may then perform one or more additional steps prior to proceeding to block 205. In some embodiments, for example, the message server determines in block 203 whether the databases for all of the running design applications (noted in block 201) are synchronized, and proceeds to perform any necessary synchronization. After reaching block 205, the message server program awaits a message from a design application. When a message is received, the message server program proceeds to block 207 and determines if the message represents a new program being activated by the user. If yes, the message server program adds the newly-activated program to the list of running applications at block 211. At block 213, the message server program imports a database to the newly-activated program from the last application in which the user made an edit or took other action. If the user has not made an edit (or taken other action) with another application since initiating the message server program, a database is imported from one of the other programs noted at block 201 or as otherwise specified by the user. The message server then returns to block 205 and awaits the next message from a design application.

If a message received from a design application is not notification that the user has initiated a new design application, the message server program proceeds from block 207 to block 209, and determines if the message contains (or points to) edit data from one of the running design applications. If yes, the edit data is sent to all other running design applications at block 215, after which the message server program returns to block 205 to await the next message. If a message received at block 205 is not notification of a newly opened design application or of edit data from an open application, the message server program proceeds from block 209 to perform other appropriate action (e.g., removing a design application from the list of running design applications if the message indicates the user has shut down the application). The dashed line box and vertical ellipsis after block 209 indicate that various other commands for other types of messages could be included.

As previously indicated, the invention is not limited by the types of applications which may be simultaneously running on a computer. Instead, the invention includes simultaneous execution of many different types of PCB applications. For example, instead of the three types of applications described with regard to applications D, E and F above, a user may instead be switching between a layout and routing application, a circuit analysis application, and a computer aided manufacturing (CAM) application. After the user places a series of components and routes connections between those components using the layout and routing program, the user could then switch to the circuit analysis program to determine the electrical and/or electromagnetic effects of the routes added to the design. The user could then switch to the CAM application to add data specific to the manufacturing process (es) used to manufacture the PCB. Accordingly, as used in this specification (including the claims), the term "PCB application" is not limited to applications such as applications D, E or F. Similarly, "information" or "data" regarding a PCB design is not limited to placement and routing data or to other types of data generated by applications such as applications D, E or F. The invention is not limited by the number of applications which may be simultaneously used. Only two applications might be simultaneously running, or more than three applications may be simultaneously running.

Although several examples of carrying out the invention have been described, those skilled in the art will appreciate that there are numerous variations and permutations of the above described examples that fall within the spirit and scope of the invention as set forth in the appended claims. For example, a machine-readable medium may have instructions stored thereon that, when executed by one or more processors, cause one or more computers to perform the steps of the described methods. The algorithms, system configurations and other aspects described are merely examples. Modifications of the described algorithms, systems and aspects are within the scope of the invention, as are numerous other algorithms, configurations and aspects.

The invention claimed is:

1. A method for integrating execution of, and data sharing between, a plurality of printed circuit board (PCB) application programs simultaneously executing upon a computer, comprising:
   (a) generating, by using the computer, data regarding a PCB design, said data being generated by a first application of the plurality in response to a user input directed to the first application;
   (b) storing the generated data within a first database associated with the first application;
   (c) notifying a message server program of the data generated in step (a), wherein the message server program is also simultaneously executing upon the computer, and wherein the notification is provided by the first application;
   (d) receiving, in second and third applications of the plurality, notification from the message server program of the data generated in step (a);
   (e) storing, in response to the notification received in step (d), at least a portion of the data generated in step (a) within a second database associated with the second application and within a third database associated with the third application;
   (f) generating additional data regarding the PCB design, said additional data being generated with the second application in response to a user input directed to the second application and using at least a portion of the data stored in the second database in step (e);
   (g) notifying the message server program of the data generated in step (f), wherein the notification is provided by the second application;
   (h) receiving, in the first and third applications, notification from the message server program of the data generated in step (f);
   (i) storing, in response to the notification received in step (h), at least a portion of the data generated in step (f) within the first database and within the third database; and
   (j) generating further data regarding the PCB design, said further data being generated with the third application in response to a user input directed to the third application and using at least a portion of the data stored in the third database in step (i), wherein
      steps (c) through (e) and steps (g) through (i) occur without manual user invocation of a separate command to transfer data between databases,
      the data stored in the second database in step (e) includes data not used by the second application,
      the data stored in the first database in step (i) includes data not used by the first application, and
      the data stored in the third database in step (i) includes data not used by the third application.

2. The method of claim 1, further comprising:
   (k) notifying the message server program of the data generated in step (j), wherein the notification is provided by the third application;
   (l) receiving, in the first and second applications, notification from the message server program of the data generated in step (j);
   (m) storing, in response to the notification received in step (l), at least a portion of the data generated in step (j) within the first database and within the second database;
   (n) generating subsequent data regarding the PCB design with the first application using at least a portion of the data stored in step (m) within the first database; and
   (o) generating more data regarding the PCB design with the second application using at least a portion of the data stored in step (m) within the second database.

3. The method of claim 2, wherein
   the data stored in the first database in step (m) includes data not used by the first application, and
   the data stored in the second database in step (m) includes data not used by the second application.

4. The method of claim 1, wherein at least one of the first and second applications comprises a software program for placing components on a PCB design and for routing connections between placed components.

5. The method of claim 1, further comprising:
   (k) initiating execution on the computer of a fourth application program which was not executing during performance of steps (a) through (j);
   (l) storing at least a portion of the data stored in steps (b), (e) and (i) in a fourth database associated with the fourth application;
   (m) receiving a fourth input from the user and directed to the fourth application; and
   (n) generating further data regarding the PCB design, said further data being generated with the fourth application in response to the fourth input and using at least a portion of the data stored in step (l), and wherein:
      step (l) occurs without manual user invocation of a separate command to import data from the first, second or third database to the fourth database.

6. A machine-readable medium having stored thereon data representing sequences of instructions which, when executed by a processor, cause the processor to perform steps comprising:
- (a) generating data regarding a PCB design, said data being generated by a first of a plurality of printed circuit board (PCB) application programs simultaneously executing upon a computer, said data being generated in response to a user input directed to the first application;
- (b) storing the generated data within a first database associated with the first application;
- (c) notifying a message server program of the data generated in step (a), wherein the message server program is also simultaneously executing upon the computer, and wherein the notification is provided by the first application;
- (d) receiving, in second and third applications of the plurality, notification from the message server program of the data generated in step (a);
- (e) storing, in response to the notification received in step (d), at least a portion of the data generated in step (a) within a second database associated with the second application and within a third database associated with the third application;
- (f) generating additional data regarding the PCB design, said additional data being generated with the second application in response to a user input directed to the second application and using at least a portion of the data stored in the second database in step (e);
- (g) notifying the message server program of the data generated in step (f), wherein the notification is provided by the second application;
- (h) receiving, in the first and third applications, notification from the message server program of the data generated in step (f);
- (i) storing, in response to the notification received in step (h), at least a portion of the data generated in step (f) within the first database and within the third database; and
- (j) generating further data regarding the PCB design, said further data being generated with the third application in response to a user input directed to the third application and using at least a portion of the data stored in the third database in step (i), wherein
  - steps (c) through (e) and steps (g) through (i) occur without manual user invocation of a separate command to transfer data between databases,
  - the data stored in the second database in step (e) includes data not used by the second application,
  - the data stored in the first database in step (i) includes data not used by the first application, and
  - the data stored in the third database in step (i) includes data not used by the third application.

7. The machine-readable medium of claim 6, comprising further instructions for performing steps comprising:
- (k) notifying the message server program of the data generated in step (j), wherein the notification is provided by the third application;
- (l) receiving, in the first and second applications, notification from the message server program of the data generated in step (j);
- (m) storing, in response to the notification received in step (l), at least a portion of the data generated in step (j) within the first database and within the second database;
- (n) generating subsequent data regarding the PCB design with the first application using at least a portion of the data stored in step (m) within the first database; and
- (o) generating more data regarding the PCB design with the second application using at least a portion of the data stored in step (m) within the second database.

8. The machine-readable medium of claim 7, wherein the data stored in the first database in step (m) includes data not used by the first application, and
the data stored in the second database in step (m) includes data not used by the second application.

9. The machine-readable medium of claim 6, wherein at least one of the first and second applications comprises a software program for placing components on a PCB design and for routing connections between placed components.

10. The machine-readable medium of claim 6, comprising further instructions for performing steps comprising:
- (k) initiating execution on the computer of a fourth application program which was not executing during performance of steps (a) through (j);
- (l) storing at least a portion of the data stored in steps (b), (e) and (i) in a fourth database associated with the fourth application;
- (m) receiving a fourth input from the user and directed to the fourth application; and
- (n) generating further data regarding the PCB design, said further data being generated with the fourth application in response to the fourth input and using at least a portion of the data stored in step (l), and wherein:
  - step (l) occurs without manual user invocation of a separate command to import data from the first, second or third database to the fourth database.

* * * * *

UNITED STATES PATENT AND TRADEMARK OFFICE
CERTIFICATE OF CORRECTION

PATENT NO. : 7,590,963 B2  
APPLICATION NO. : 10/983132  
DATED : September 15, 2009  
INVENTOR(S) : Vladimir V. Petunin It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1116 days.

Signed and Sealed this

Twenty-first Day of September, 2010

David J. Kappos  
*Director of the United States Patent and Trademark Office*